United States Patent
Kulkarni et al.

(10) Patent No.: US 7,756,658 B2
(45) Date of Patent: Jul. 13, 2010

(54) SYSTEMS AND METHODS FOR DETECTING DEFECTS ON A WAFER AND GENERATING INSPECTION RESULTS FOR THE WAFER

(75) Inventors: Ashok Kulkarni, San Jose, CA (US); Santosh Bhattacharyya, San Jose, CA (US)

(73) Assignee: KLA-Tencor Corp., San Jose, CA (US)

( * ) Notice: Subject to any disclaimer, the term of this patent is extended or adjusted under 35 U.S.C. 154(b) by 113 days.

(21) Appl. No.: 12/120,574

(22) Filed: May 14, 2008

(65) Prior Publication Data

US 2009/0287440 A1 Nov. 19, 2009

(51) Int. Cl.
*G01N 37/00* (2006.01)
(52) U.S. Cl. .......................... 702/83; 702/35; 702/183; 356/237.1
(58) Field of Classification Search .............. 702/35, 702/83
See application file for complete search history.

(56) References Cited

U.S. PATENT DOCUMENTS

| | | | |
|---|---|---|---|
| 5,991,699 | A | 11/1999 | Kulkarni et al. |
| 6,718,526 | B1 | 4/2004 | Eldredge et al. |
| 7,006,886 | B1 | 2/2006 | Huet et al. |
| 7,067,819 | B2 | 6/2006 | Janik |
| 7,142,992 | B1 * | 11/2006 | Huet et al. ............... 702/58 |
| 7,286,218 | B2 | 10/2007 | Tiemeyer et al. |
| 7,346,465 | B1 * | 3/2008 | Subramaniam et al. ...... 702/82 |
| 7,349,079 | B2 | 3/2008 | Zhao et al. |
| 7,359,052 | B2 | 4/2008 | Fielden et al. |
| 7,369,233 | B2 | 5/2008 | Nikoonahad et al. |
| 7,417,722 | B2 | 8/2008 | Bills et al. |
| 7,617,427 | B2 * | 11/2009 | Haehn et al. ............. 714/724 |
| 7,660,687 | B1 * | 2/2010 | De et al. ............... 702/85 |
| 2002/0181757 | A1 | 12/2002 | Takeuchi |

(Continued)

FOREIGN PATENT DOCUMENTS

JP 07-294447 11/1995

(Continued)

OTHER PUBLICATIONS

International Application No. PCT/US05/45781 filed on Dec. 12, 2005.

(Continued)

*Primary Examiner*—Bryan Bui
*Assistant Examiner*—Jonathan Teixeira Moffat
(74) *Attorney, Agent, or Firm*—Ann Marie Mewherter

(57) ABSTRACT

Systems and methods for detecting defects on a wafer and generating inspection results for the wafer are provided. One method includes detecting defects on a wafer by comparing output generated by scanning of the wafer performed by an inspection system to one or more defect detection thresholds. The method also includes sampling outliers in the output by selecting the output having the highest values from bins defined based on one or more predetermined criteria. In addition, the method includes selecting a portion of the sampled outliers based on wafer-level analysis of the sampled outliers. The method further includes generating inspection results for the wafer by combining information about the selected portion of the sampled outliers with information about the defects detected using the one or more defect detection thresholds.

20 Claims, 4 Drawing Sheets

U.S. PATENT DOCUMENTS

| | | | |
|---|---|---|---|
| 2004/0138846 A1* | 7/2004 | Buxton et al. | 702/108 |
| 2005/0252752 A1 | 11/2005 | Fielden et al. | |
| 2005/0278597 A1* | 12/2005 | Miguelanez et al. | 714/738 |
| 2006/0181700 A1 | 8/2006 | Andrews et al. | |
| 2006/0192948 A1 | 8/2006 | Judell et al. | |
| 2006/0192949 A1 | 8/2006 | Bills et al. | |
| 2006/0192950 A1 | 8/2006 | Judell et al. | |
| 2006/0256326 A1 | 11/2006 | Bills et al. | |
| 2007/0024998 A1 | 2/2007 | Bills et al. | |
| 2007/0156379 A1 | 7/2007 | Kulkarni et al. | |
| 2007/0252977 A1 | 11/2007 | Baran et al. | |
| 2007/0288219 A1 | 12/2007 | Zafar et al. | |
| 2009/0080759 A1* | 3/2009 | Bhaskar et al. | 382/141 |

FOREIGN PATENT DOCUMENTS

| | | |
|---|---|---|
| JP | 2004-117229 | 4/2004 |
| JP | 2005-181347 | 7/2005 |
| WO | WO 2006/066135 | 6/2006 |
| WO | WO 2006/066136 | 6/2006 |
| WO | WO 2006/066137 | 6/2006 |
| WO | WO 2006/066138 | 6/2006 |
| WO | WO 2006/066139 | 6/2006 |
| WO | WO 2006/066205 | 6/2006 |
| WO | WO 2006/066206 | 6/2006 |
| WO | WO 2006/066207 | 6/2006 |
| WO | WO 2006/066255 | 6/2006 |

OTHER PUBLICATIONS

U.S. Appl. No. 60/772,418 (Kirk et al.) entitled Methods and Systems for Determining a Characteristic of a Wafer filed on Feb. 9, 2006.

U.S. Appl. No. 60/974,030 (Bhaskar et al.) entitled Systems and Methods for Creating Persistent Data for a Wafer and for Using Persistent Data for Inspection-Related Functions filed on Sep. 20, 2007.

U.S. Appl. No. 11/830,485 (Kulkarni et al.) entitled Semiconductor Device Property Extraction, Generation, Visualization, and Monitoring Methods filed on Jul. 30, 2007.

U.S. Appl. No. 11/859,342 (Chen et al.) entitled Computer-Implemented Methods, Carrier Media, and Systems for Creating a Defect Sample for Use in Selecting One or More Parameters of an Inspection Recipe filed on Sep. 21, 2007.

Written Opinion and International Search Report for PCT/US2009/043814, mailed Dec. 8, 2009.

* cited by examiner

SYSTEMS AND METHODS FOR DETECTING DEFECTS ON A WAFER AND GENERATING INSPECTION RESULTS FOR THE WAFER

BACKGROUND OF THE INVENTION

1. Field of the Invention

The present invention generally relates to systems and methods for detecting defects on a wafer and generating inspection results for the wafer. Certain embodiments relate to a computer-implemented method for generating inspection results for a wafer by combining information about defects detected based on global criteria and local criteria.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Current patterned wafer defect detection methods involve scanning a wafer and making a decision regarding whether a pixel is defective or not, based on comparing the local neighborhood of the pixel with corresponding pixels in adjacent dies (or a reference die) and using methods to segment pixel populations based on noise or criticality (to yield) to select an appropriate threshold to be applied to the candidate pixel for making a defect/no defect decision. As soon as the defect is detected, it is marked for reporting to the next stage of the processing pipeline. Other methods for detection may first select a set of candidate pixels using a simpler (less computation) test followed by a more complex computation applied only to the candidates to determine the final defects. However, none of these methods use global, i.e., wafer wide criteria, to determine the defects to be reported (or not). The decision on which defects to report is based on local data only.

Current patterned wafer defect detection methods, therefore, have a number of disadvantages. For example, these methods do not simultaneously sample random and systematic defects. In addition, defects are flagged based on the inspection recipe, and the defect detection algorithm has no knowledge of global (wafer-wide phenomena) since the algorithm works on one frame at a time. Systematic defects may be separately monitored by recording a wafer level noise map.

However, while the noise map may show a signature of systematic defects, defects from the location(s) where the anomalous signature is present may not have been detected by the threshold. Therefore, information about those defects may not have been stored such that it could be used for reporting or other purposes.

Accordingly, it would be advantageous to develop methods and systems for detecting defects on a wafer and generating inspection results for the wafer by "intelligent" defect sampling that takes into account both wafer-level criteria and local criteria.

SUMMARY OF THE INVENTION

The following description of various embodiments of methods, computer-readable media, and systems is not to be construed in any way as limiting the subject matter of the appended claims.

One embodiment relates to a computer-implemented method for detecting defects on a wafer and generating inspection results for the wafer. The method includes detecting defects on a wafer by comparing output generated by scanning of the wafer performed by an inspection system to one or more defect detection thresholds. The method also includes sampling outliers in the output by selecting the output having the highest values from bins defined based on one or more predetermined criteria. In addition, the method includes selecting a portion of the sampled outliers based on wafer-level analysis of the sampled outliers. The method further includes generating inspection results for the wafer by combining information about the selected portion of the sampled outliers with information about the defects detected using the one or more defect detection thresholds.

In one embodiment, the one or more defect detection thresholds do not include a hot threshold. In another embodiment, the sampling step is performed without applying a defect detection threshold to the output. In an additional embodiment, a substantial portion of the sampled outliers have values below the one or more defect detection thresholds. In a further embodiment, the sampling step is performed for only the output that does not correspond to the defects detected using the one or more defect detection thresholds.

In one embodiment, the one or more predetermined criteria include gray level, local texture, difference gray level between die, region type, design context, or some combination thereof. In another embodiment, a number of the outliers that are sampled is limited only by memory capacity of a computer subsystem that performs the sampling step. In an additional embodiment, the sampling step includes sampling a number of the outliers from each of the bins. In a further embodiment, the sampled outliers and the defects include random defects and systematic defects. In still another embodiment, the selected portion of the sampled outliers does not include all of the sampled outliers.

In one embodiment, the wafer-level analysis includes statistical analysis of the sampled outliers and identifying patterns in results of the statistical analysis. In another embodiment, the wafer-level analysis includes analyzing the sampled outliers for wafer-level signatures. In an additional embodiment, the wafer-level analysis includes creating a wafer map from the sampled outliers, and the selecting step includes analyzing the wafer map to select the portion of the sampled outliers. In a further embodiment, the wafer-level analysis includes creating a stacked die map from the sampled outliers and analyzing the stacked die map to identify a signature in the stacked die map, and the selecting step includes selecting the portion of the sampled outliers based on the signature in the stacked die map.

In one embodiment, the wafer-level analysis includes overlaying design context information on a map of the sampled outliers and identifying one or more systematic defect mechanisms based on the design context information overlaid on the map, and the selecting step includes selecting at least some of the sampled outliers corresponding to the one or more systematic defect mechanisms. In another embodiment, the wafer-level analysis includes identifying one or more signatures present in the sampled outliers, and the selecting step includes comparing the defects detected using the one or more defect detection thresholds to the one or more signatures and selecting at least some of the sampled outliers such that the inspection results include at least some of the sampled outliers or defects corresponding to each of the one or more signatures. In an additional embodiment, the wafer-level analysis includes identifying an area on the wafer in which a number of the sampled outliers located in the area is higher than other areas of the wafer, and the selecting step includes selecting at least some of the sampled outliers located in the area.

In some embodiments, the selecting step includes selecting the portion of the sampled outliers conditionally based on results of the wafer-level analysis of other sampled outliers. In one embodiment, the detecting step and the sampling step are performed by computer nodes, and the selecting step and the generating step are performed by a host.

Each of the steps of each of the embodiments of the method described above may be further performed as described herein. In addition, each of the embodiments of the computer-implemented method described above may include any other step(s) of any other method(s) described herein. Furthermore, each of the embodiments of the computer-implemented method described above may be performed by any of the systems described herein.

Another embodiment relates to a computer-readable medium that includes program instructions executable on a computer system for performing a computer-implemented method for detecting defects on a wafer and generating inspection results for the wafer. The computer-implemented method includes detecting defects on a wafer by comparing output generated by scanning of the wafer performed by an inspection system to one or more defect detection thresholds. The method also includes sampling outliers in the output by selecting the output having the highest values from bins defined based on one or more predetermined criteria. In addition, the method includes selecting a portion of the sampled outliers based on wafer-level analysis of the sampled outliers. The method further includes generating inspection results for the wafer by combining information about the selected portion of the sampled outliers with information about the defects detected using the one or more defect detection thresholds.

Each of the steps of the computer-implemented method described above may be further performed as described herein. In addition, the computer-implemented method may include any other step(s) of any other method(s) described herein. The computer-readable medium may be further configured as described herein.

An additional embodiment relates to a system configured to detect defects on a wafer and generate inspection results for the wafer. The system includes an inspection subsystem configured to generate output by scanning a wafer. The system also includes a computer subsystem configured to detect defects on the wafer by comparing the output to one or more defect detection thresholds. The computer subsystem is also configured to sample outliers in the output by selecting the output having the highest values from bins defined based on one or more predetermined criteria. In addition, the computer subsystem is configured to select a portion of the sampled outliers based on wafer-level analysis of the sampled outliers. The computer subsystem is further configured to generate inspection results for the wafer by combining information about the selected portion of the sampled outliers with information about the defects detected using the one or more defect detection thresholds. The system may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
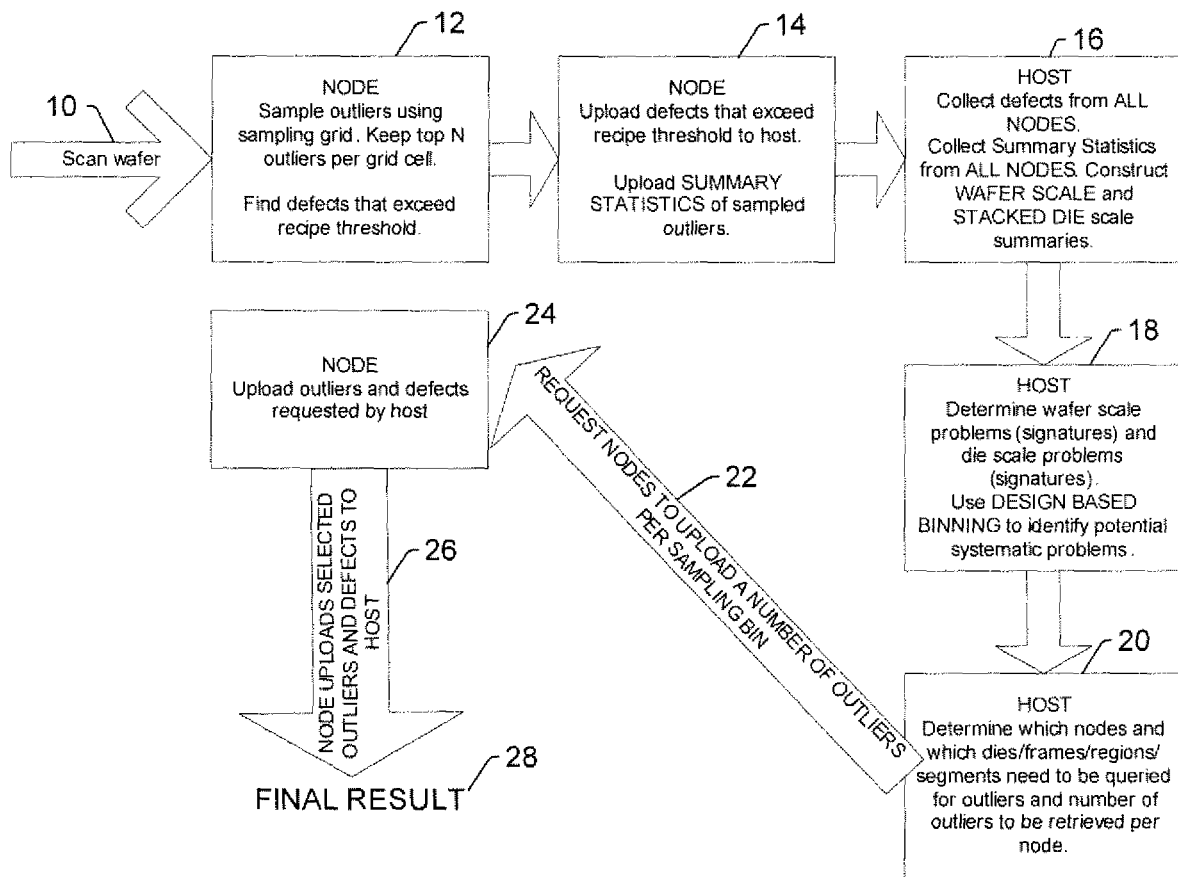
FIG. 1 is a flow chart illustrating one embodiment of a computer-implemented method for detecting defects on a wafer and generating inspection results for the wafer.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

One or more layers may be formed upon a wafer. Many different types of such layers are known in the art, and the term wafer as used herein is intended to encompass a wafer on which all types of such layers may be formed. One or more layers formed on a wafer may be patterned. For example, a wafer may include a plurality of dies, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit (IC), a thin-film head die, a micro-electromechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In general, the embodiments described herein are configured for intelligent defect sampling. For example, as described further herein, the embodiments may be used for detecting and reporting defects based not just on local criteria but also global criteria to determine which defects (anomalies) to report. In particular, one embodiment relates to a computer-implemented method for detecting defects on a wafer and generating inspection results for the wafer. The defects on the wafer may include any defects known in the art and may vary depending on one or more characteristics of the wafer (e.g., the type of wafer or the process performed on the wafer prior to inspection).

The method includes detecting defects on a wafer by comparing output generated by scanning of the wafer performed by an inspection system to one or more defect detection thresholds. The output generated by scanning of the wafer may include any suitable output and may vary depending on the configuration of the inspection system and/or the inspection recipe used to perform the wafer scanning. For example, the output may include signals, data, images, or image data responsive to light scattered from the wafer (e.g., in the case of dark field (DF) inspection systems) or images or image data responsive to light reflected from the wafer (e.g., in the case of bright field (BF) inspection systems). The inspection system may be a commercially available inspection system such as the 28xx systems, which are commercially available from KLA-Tencor, San Jose, Calif. The inspection system may be configured for inspection of patterned wafers and/or unpatterned wafers. In addition, the inspection system may be configured for BF inspection and/or DF inspection, possibly in combination with one or more other inspection modes (e.g., an aperture mode of inspection). Furthermore, the inspection system may be configured as an optical inspection system or another type of inspection system (e.g., an electron beam inspection system). The scanning of the wafer may be performed by the inspection system in any suitable manner. For example, the wafer may be moved (by a stage of the inspection system) with respect to the optics of the inspection system such that the illumination of the inspection system traces a serpentine path over the wafer as light from the wafer is detected.

As the wafer is being scanned, the output (e.g., wafer image) generated by scanning may be processed, for example, by computing a difference signal between corresponding image signals from adjacent dies and then comparing this difference signal output to one or more defect detection thresholds. The one or more defect detection thresholds are used to detect the defects based on local criteria. For example, the one or more defect detection thresholds may be used to make a decision regarding whether a pixel is defective or not, based on comparing the local neighborhood of the pixel with corresponding pixels in adjacent dies (or a reference die) and segmenting pixel populations based on noise or criticality (to yield) to select an appropriate defect detection threshold to be applied to the candidate pixel for making a defect/no defect decision. Other methods for detection using the one or more defect detection thresholds may first select a set of candidate pixels using a simpler (less computation) test followed by a more complex computation applied only to the candidates to detect defects. The defects may be detected based only on the local criteria.

Defects may be detected using the defect detection threshold(s) specified in the inspection recipe. For example, the one or more defect detection thresholds that are used to detect the defects on the wafer may be defect detection thresholds of one or more defect detection algorithms, which are included in the inspection recipe and which are applied to the output generated by scanning the wafer. The one or more defect detection algorithms that are applied to the output generated by scanning the wafer may include any suitable defect detection algorithm(s) and may vary depending on the type of output generated by scanning and the type of inspection that is being performed on the wafer. Examples of suitable defect detection algorithms, one or more defect detection thresholds of which can be compared to the output to detect the defects on the wafer, include segmented auto-thresholding (SAT) or multiple die auto-thresholding (MDAT), which are used by commercially available inspection systems such as those from KLA-Tencor.

In one embodiment, the one or more defect detection thresholds do not include a hot threshold. A "hot threshold" can be generally defined as a defect detection threshold having a value that is approximately equal to a noise level in the output. For example, the one or more defect detection thresholds may include the recipe defect detection thresholds (which are typically run fairly cold during production). In other words, the one or more defect detection thresholds may have values of the defect detection thresholds used in a production inspection recipe (i.e., an inspection recipe used to inspect wafers during manufacturing) as opposed to other defect detection threshold values such as those used during inspection recipe set up. In this manner, the method does not include detecting defects on the wafer by running a substantially hot recipe thereby preventing a substantially large and possibly prohibitive number of defects from being reported, which would then have to be analyzed to produce a representative sample for review.

The method also includes sampling outliers in the output by selecting the output having the highest values from bins defined based on one or more predetermined criteria. For example, the output that is sampled may have the highest values in that they are the "topmost outliers" or the outliers with the largest amount of "signal." The term "bins" is used herein interchangeably with the term "sampling cells." For example, the "top" outliers in each sampling cell may be sampled. In addition, sampling the outliers may include capturing the "topmost" outliers in all die based on a sampling scheme as described further herein.

The term "outliers" as used herein is intended to refer to discrete portions of the output that have values that are outlying with respect to other portions of the output and to differentiate between "defects" that are detected using one or more defect detection thresholds and "outliers," which may correspond to defects on the wafer, but are not identified as defects using one or more defect detection thresholds. For example, in one embodiment, sampling the outliers is performed without applying a defect detection threshold to the output. More specifically, no steps involved in generating the sampled outliers (e.g., from identifying the outliers to binning the outliers to sampling the outliers) includes applying a defect detection threshold to the output. For example, the topmost outliers may be sampled without applying a defect detection threshold (either fixed or adaptive based on local noise). Since the outliers are identified without using one or more defect detection thresholds, the outliers that are identified may correspond to both real defects on the wafer and noise or nuisance events. However, the outliers are sampled as described herein by selecting the outliers having the highest values thereby reducing the percentage of the outliers that correspond to noise or nuisance events in the sampled population of outliers, which is further processed as described herein. As a result, a substantial portion of the sampled outliers, a portion of which is selected as described further herein and included in the inspection results, may correspond to actual defects that have signals below the one or more defect detection thresholds instead of noise or nuisance events.

In an additional embodiment, sampling the outliers is performed for only the output that does not correspond to the defects detected using the one or more defect detection thresholds. For example, the output generated by scanning the wafer may be compared to one or more defect detection thresholds as described above to detect defects on the wafer. Any output that does not correspond to a defect detected using the one or more defect detection thresholds may then be processed to determine if it is an outlier. Outliers in the output may be identified in any suitable manner. For example, its value may be compared to the median and standard deviation of the values for other portions of the output, and if the value of the portion of the output is outside of some multiple of the standard deviation, the portion of the output may be determined to be an outlier.

As outliers are identified, they may be assigned to certain bins. For example, any time an outlier in the output is identified, values of the outlier for the one or more predetermined criteria such as segment/region may be determined. The method may then include determining if a bin for that segment/region has been created. If not, a unique bin may be created with that bin ID/segment/region as the name of the bin, and that outlier may be added to the newly created bin. If the bin already exists and has not been filled to its capacity (which may be determined based on storage capacity as described further herein), the outlier may be added to a sorted list (e.g., sorted by outlier magnitude) of outliers in the bin. If the bin is full, the method may include determining if the "lowest" outlier in the list is higher than the current outlier. If so, the current outlier may be discarded. If not, the current outlier may be added in the appropriate place in the ordered list after throwing out the "lowest" outlier. Thus, at all times, a sorted list of outliers may be associated with each bin.

In another embodiment, a substantial portion of the sampled outliers have values below the one or more defect detection thresholds. For example, because sampling the outliers may be performed without applying a defect detection threshold to the output, the sampled outliers may have values below the one or more defect detection thresholds. In addition, presumably, since comparing the output to one or more defect detection thresholds will result in the identification of any output having values above the one or more defect detection thresholds as defects and such output may be excluded from processing involved in identifying outliers in the output, all of the outliers identified and subsequently sampled may have values below the one or more defect detection thresholds. Such sampled outliers may correspond to relatively subtle defect mechanisms that may be at work below the defect detection threshold(s) specified in the recipe.

In one embodiment, the one or more predetermined criteria include gray level, local texture, difference gray level between die, region type, design context, or some combination thereof. For example, the sampling plan for the outliers can be based on any number of criteria such as gray level, local texture, difference gray level between die, region type in which the pixel lies, design context, etc. Variants of these selection criteria are also possible. For example, if the sampling cells are based on die number, design context, and gray level, the design context may be divided into, for example, 4 context types, and the gray level may be divided into, for example, 16 gray level intervals. In another example, the predetermined criteria may include some combination of die number, region identity (ID), segment ID, channel ID (e.g., for inspectors with multiple imaging channels), and other measures.

In some embodiments, a number of the outliers that are sampled is limited only by memory capacity of a computer subsystem that performs the sampling. For example, all available memory within each detection node (e.g., each processor within an image computer) may be used to sample the "topmost outliers." In this manner, the method may include sampling a substantially larger number of outliers into memory during the scan than methods that simply store defects that are detected by applying defect detection threshold(s) to output generated by the scan. For example, if there are 100 dies on the wafer and the sampling cells are configured as described above based on 4 context types and 16 gray level intervals, in that case, each node may sample (keep) the topmost, say, 100 outliers in each of the 4×16=64 sampling cells for each die that the node processes. If a system that performs the method has 16 processing nodes, each node could sample (keep) up to 64 cells×100 dies×100 outliers per cell per die=640,000 outliers in its memory.

In one embodiment, sampling the outliers includes sampling a number of the outliers from each of the bins. For example, sampling the outliers from each of the bins may be advantageous such that at least some outliers are sampled for all of the different values or intervals for the one or more predetermined criteria. In this manner, at least some outliers corresponding to each of the different values or intervals for the one or more predetermined criteria can be further processed as described herein to determine problems on the wafer across all of the different values or intervals for the one or more predetermined criteria. The number of the outliers from each of the bins that are sampled may be the same or may vary. For example, the target number of outliers to be sampled from bins corresponding to relatively high gray level difference intervals may be higher than the target number of outliers to be sampled from bins corresponding to relatively low gray level difference intervals. The target number of outliers to be sampled from each of the bins (whether the same or different) may be determined based on the number of the bins and the storage capacity of the system in which the information about the outliers is stored as described above. However, the target number of outliers to be sampled from each of the bins (whether the same or different) may also be selected by a user or based on some user-defined parameter included in a recipe that is used to perform the sampling.

In another embodiment, the sampled outliers and the defects include random defects and systematic defects. For example, the defects detected using the one or more defect detection thresholds may include random defects and some defects due to systematic mechanisms. In addition, the sampled outliers may include both random defects and defects due to certain systematic mechanisms that can be detected only by analyzing data at the wafer level. Therefore, the embodiments described herein can be used during a production inspection scan of a wafer to allow for concurrently capturing the defects that exceed the inspection recipe defect detection threshold(s) and simultaneously sampling the outlier distribution so as to capture systematic defect mechanisms.

The method may also include storing various information about the sampled outliers and the detected defects. The various information may include information that can be used to retrieve a selected portion of the sampled outliers and the detected defects from one or more storage media in which the sampled outliers and the detected defects are stored. For example, in order to select outliers located in all parts of the wafer and all dies on the wafer as described further herein for inclusion in the inspection results, the method may store information about the sampled outliers (from the job it is processing) that is of a "geographical" nature so that the method can sample the outliers and store in memory (from job-to-job). This geographical data may include one-time global information (e.g., die dimensions, wafer layout, sample plan, etc.), die # (e.g., using some universal die numbering scheme), swath # (can be relative to die row), and subswath identity. Alternatively, all of the above geographical information could be encoded into a unique identity for each of the bins which can be used in further steps described herein.

The method further includes selecting a portion of the sampled outliers based on wafer-level analysis of the sampled outliers. Selecting the portion of the sampled outliers is performed to determine which sampled outliers will be combined with the defects detected using the one or more defect detection thresholds to complete the inspection results. The wafer-level analysis may include any of the wafer-level analysis described herein. In one embodiment, the selected portion of the sampled outliers does not include all of the sampled outliers. For example, the number of sampled outliers may be relatively large (and possibly even enormous depending on the memory capacity of the system in which the information about the outliers is stored). In addition, the entire population of the sampled outliers may include a significant amount of noise or nuisance events or outliers that do not correspond to a defect or defect mechanism that is interesting to the user. Therefore, selecting only a portion of the sampled outliers and not all of the sampled outliers for inclusion in the inspection results may be advantageous such that the selected portion of the sampled outliers provides meaningful information about the wafer to the user without overwhelming the user with information that is not of interest.

In addition, unlike methods in which only a portion of an entire population of defects detected on a wafer or other specimen are selected for further processing (e.g., sampling for defect review), the portion of the sampled outliers that are not selected are not included in the inspection results generated as described further herein. For instance typically a population of defects is detected on a wafer and information about the entire population of defects is included in inspection results generated for the wafer. Subsequently, only a portion of the defects may be selected for some function (e.g., defect review, defect analysis, defect repair, etc.). However, the inspection results generated for the wafer still include the information for the defects that are not selected for the other function. In other words, the information for the non-selected portion of the defects is not removed from the inspection results.

In one embodiment, the wafer-level analysis includes statistical analysis of the sampled outliers and identifying patterns in results of the statistical analysis. For example, at the end of a wafer scan, the wafer-level analysis may include collecting statistics on a wafer scale. Based on analysis of patterns in the statistics, the method may select outliers from the captured sample of outliers for final reporting as "defects" in the inspection results. In this manner, summary statistics may be used to select the portion of the sampled outliers. The summary statistics may include, for example, the number of outliers in each sampling cell, average strength, size, polarity, or other such measures. The statistical analysis may be performed in any suitable manner using any suitable method and/or algorithm. The patterns in the results of the statistical analysis may be identified in any suitable manner using any suitable method and/or algorithm.

In an additional embodiment, the wafer-level analysis includes analyzing the sampled outliers for wafer-level signatures. For example, the wafer-level analysis may include wafer noise map analysis for signatures. The wafer-level signatures may be identified by spatial signature analysis (SSA) of the sampled outliers across the wafer. In this manner, the wafer-level signatures may be detected using a type of image analysis. Examples of SSA methods and systems that may be used in the embodiments described herein are illustrated in commonly owned U.S. Pat. No. 5,991,699 to Kulkarni et al., U.S. Pat. No. 6,718,526 to Eldredge et al., and U.S. Pat. No. 7,006,886 to Huet et al., which are incorporated by reference as if fully set forth herein. The embodiments described herein may include any step(s) of any of the method(s) described in these patents. Results of the wafer noise map analysis may also be used to perform one or more other steps including any of those described in commonly owned U.S. patent application Ser. No. 11/830,485 by Kulkarni et al. filed Jul. 30, 2007, which is incorporated by reference as if fully set forth herein. The embodiments described herein may include any step(s) of any method(s) described in this patent application.

In a further embodiment, the wafer-level analysis includes creating a wafer map from the sampled outliers, and selecting the portion of the sampled outliers includes analyzing the wafer map to select the portion of the sampled outliers. For example, summary statistics for the sampled outliers may be used to generate a wafer scale "map" of the sampled outliers. In addition, the method may include analyzing the wafer scale "map" of the sampled outliers for signatures that may indicate a problem on the wafer. In this manner, the method may include selecting a portion of the outliers from the sampled outliers using the wafer map signatures as indicators of problems. More specifically, selecting the portion of the outliers may include selecting the outliers corresponding to the wafer map signatures such that the inspection results generated as described further herein may be indicative of potential problems on the wafer. The wafer map may be created as described further herein, and the wafer map may be analyzed as described further herein to select the portion of the sampled outliers.

In some embodiments, the wafer-level analysis includes creating a stacked die map from the sampled outliers and analyzing the stacked die map to identify a signature in the stacked die map. In one such embodiment, the selecting step includes selecting the portion of the sampled outliers based on the signature in the stacked die map. For example, the method may include using a wafer map created as described above to create a stacked die map by combining data across die for each frame within a die. The wafer-level analysis may include stacked die noise map analysis for signatures. The stacked die noise map analysis for signatures may be performed as described above with respect to wafer noise map analysis for signatures. In addition, the method may include analyzing the stacked die scale "map" of the sampled outliers for signatures that may indicate a problem on the wafer. For example, there could be some signature present in the stacked die map, such as areas that are more prone to defects than others. In this manner, the method may include selecting a portion of the outliers from the sampled outliers using the stacked die map signatures as indicators of problems. More specifically, selecting the portion of the outliers may include selecting the outliers corresponding to the stacked die map signatures such that the inspection results generated as described further herein may be indicative of potential problems on the wafer. The stacked die map may also be created as described further herein, and the stacked die map may be analyzed as described further herein to select the portion of the sampled outliers. Furthermore, the method may include analyzing both the wafer map and the stacked die map to determine anomalies and to select a portion of the sampled outliers corresponding to the anomalies.

In another embodiment, the wafer-level analysis includes overlaying design context information on a map of the sampled outliers and identifying one or more systematic defect mechanisms based on the design context information overlaid on the map. The design context information may be, for example, a context map that includes values for one or more attributes of design data across design data space. The one or more attributes of the design data may include, for example, functional block, design library element, cell, whether a pattern is redundant or not, pattern density, dummy/fill versus active, feature type (e.g., dummy features, contacts, line ends), feature attributes (e.g., the minimum line widths/spaces between geometries, etc.), geometrical areas in the device design that have different values of one or more attributes (e.g., type(s) of features within the areas such as contact areas or dummy fill areas, "where to inspect" information or "care areas," "critical" areas in which a process failure is possible, or some combination thereof), and the like. The design context information may be acquired from a variety of sources including simulation, modeling, and/or analysis software products that are commercially available from KLA-Tencor, other software such as DRC software, or some combination thereof. The design context information may also include any context information, context data, or context map described in commonly owned U.S. patent application Ser. No. 11/561,735 by Kulkarni et al., published as U.S. Patent Application Publication No. 2007/0156379 on Jul. 5, 2007, and Ser. No. 11/561,659 by Zafar et al., published as U.S. Patent Application Publication No. 2007/0288219 on Dec. 13, 2007, both of which were filed on Nov. 20, 2006 and which are incorporated by reference as if fully set forth herein. The design context information may also be created as described in these patent applications.

The design context information may be overlaid on the map of the sampled outliers in any suitable manner. For example, the map of the sampled outliers generated in wafer space may be aligned to the design context information in a context map generated in design space based on some reference point or points common to wafer space and design space. Such alignment of the map of the sampled outliers to the design context information may be performed in any suitable manner.

Identifying one or more systematic defect mechanisms based on the design context information overlaid on the map may be performed by analyzing the context information overlaid on the map to determine if the locations of multiple sampled outliers correspond to the locations of multiple instances of the same design context in wafer space. For example, if similar sampled outliers or simply the presence of multiple sampled outliers correspond to multiple instances of the same design context, the sampled outliers corresponding to those multiple instances of the same design context may indicate the presence of a potential systematic defect mechanism occurring in that design context. In addition, the method may include using design context information overlaid on a map such as the wafer map and/or stacked die map described above to determine systematic defect mechanism(s) that might be occurring. For example, there may be an unusually high number of outliers detected in certain design contexts, which may correspond to systematic defect mechanisms occurring on the wafer.

In one such embodiment, the selecting step includes selecting at least some of the sampled outliers corresponding to the one or more systematic defect mechanisms. For example, once the sampled outliers corresponding to the one or more systematic defect mechanisms have been identified as described above, the sampled outliers may be selected such that at least some of the sampled outliers located in at least some of the instances of the design context corresponding to each systematic defect mechanism are selected. In one such example, a sub-population of the sampled outliers that corresponds to a systematic defect mechanism may be identified, and a portion of that sub-population may be selected as described further herein (e.g., based on the bins in which the sampled outliers are included and/or the values or intervals of the one or more predetermined criteria corresponding to the bins).

In an additional embodiment, the wafer-level analysis includes identifying one or more signatures present in the sampled outliers, and the selecting step includes comparing the defects detected using the one or more defect detection thresholds to the one or more signatures and selecting at least some of the sampled outliers such that the inspection results include at least some of the sampled outliers or defects corresponding to each of the one or more signatures. For example, in order to ensure that at least some sampled outliers or defects corresponding to each type of signature are included in the inspection results, the method may include examining the actual defects reported (detected using the one or more defect detection thresholds) with the wafer, die, and design context based signatures to determine signatures for which defects were not detected using the one or more defect detection thresholds. At least some of the sampled outliers corresponding to those signatures for which defects were not detected may then be selected as described further herein. In this manner, the selecting step may include determining if reported defects caught wafer/die signatures.

In a further embodiment, the wafer-level analysis includes identifying an area on the wafer in which a number of the sampled outliers located in the area is higher than other areas on the wafer, and the selecting step includes selecting at least some of the sampled outliers located in the area. For example, there may be areas on the wafer in which there may be more outliers present (such as "scratches" due to wafer handling). The areas on the wafer, for which the numbers of the sampled outliers located in the areas are compared, may be any suitable areas on the wafer. For example, the entire area of the wafer may be divided into individual areas in an arbitrary manner (e.g., using a rectangular grid), which may then be analyzed as described above. The number of the sampled outliers located in the different areas may be determined and compared in any suitable manner. Selecting at least some of the sampled outliers located in an area in which the number of the sampled outliers located in the area is relatively high may be performed in any suitable manner and may be advantageous such that the inspection results include at least some sampled outliers that correspond to relatively large scale defects that are collectively represented in the output as a number of spatially related outliers, many of which may have values below the one or more defect detection thresholds.

In a similar manner, the wafer-level analysis may include analyzing the defects detected for different areas on the wafer. For example, the method may include determining if "adequate" defects were caught in critical region IDs. If "adequate" defects (e.g., some predetermined minimum number of defects) were not detected in some regions, the selecting step may include selecting at least some of the sampled outliers in those regions. In this manner, all different areas on the wafer may be represented in the inspection results.

The selecting step may also be performed using any other user-defined criteria for selecting a portion of the sampled outliers. In addition, the defects detected using the one or more defect detection thresholds may be sampled (for reporting or other purposes) based on some user-defined criteria.

The method also includes generating inspection results for the wafer by combining information about the selected portion of the sampled outliers with information about the defects detected using the one or more defect detection thresholds. For example, as described above, the method includes sampling a substantial number of (e.g., tens of millions of) potential defects during a wafer scan and then performing wafer-level analysis to select the defects that will be reported as the final results of the inspection. This final result can thus contain representative defects from each sub-population and reflect both random defects as well as systematic defect mechanisms that may be occurring during the manufacturing process. The inspection results may be generated in any suitable manner and may be any suitable type of inspection results in any suitable format (e.g., a KLARF file). The inspection results may be generated such that the defects and the outliers are reported simply as defects. In other words, the inspection results may not include any indicia that differentiates defects detected using the one or more defect detection thresholds from the outliers included in the inspection results as "defects." The information about the selected portion of the sampled outliers and the information about the defects included in the inspection results may include any suitable information about the sampled outliers and the defects.

In one embodiment, the detecting and sampling steps are performed by computer nodes, and the selecting and generating steps are performed by a host. For example, FIG. 1 illustrates an embodiment of a computer-implemented method for detecting defects on a wafer and generating inspection results for the wafer. FIG. 1 also shows an embodiment of the flow of information between the host and the nodes (e.g., image computer nodes) utilizing the concepts described herein. In this manner, FIG. 1 illustrates one embodiment of data flow for the embodiments described herein. It is noted that the steps shown in FIG. 1 are not essential to practice of the method. One or more steps may be omitted from or added to the method illustrated in FIG. 1, and the method can still be practiced within the scope of this embodiment. The method includes scanning a wafer, as shown in step 10 of FIG. 1. Scanning the wafer may be performed as described herein.

The detecting and sampling steps are performed by computer nodes. For example, as the wafer is being scanned, in step 12 each computer node processes some part of the wafer image or any other output generated by the scanning of the wafer. Each node detects defects using one or more defect detection thresholds specified in the inspection recipe. More specifically, each node detects defects that exceed one or more recipe defect detection thresholds. In this manner, each node performs its normal defect detection recipe. Using the one or more recipe defect detection thresholds (which are typically run fairly cold during production), the nodes may detect (say) a few hundred or a few thousand defects for the wafer.

Each node also samples the top outliers in each sampling cell. The nodes may use sampling cell definitions based on the one or more predetermined criteria to sample outliers only for the criteria specified in its job input parameter list. For example, if the sampling cells are defined based on (a) die #, (b) design context, and (c) gray level, the design context may be separated into say 4 context types and the gray level may be separated into say 16 gray level intervals. In this manners each node may sample outliers using a sampling "grid" defined based on the 4 context types and the 16 gray level intervals. Each node may sample the top N outliers per grid cell. Each node may store sampled outliers for sampling cells in its memory up to its capacity for each cell. For example, assume that there are 100 dies on the wafer. In that case, a node may store the topmost (say) 100 outliers for each of the 4×16=64 sampling cells for each die that the node processes. Thus, if the system has 16 processing nodes, each node may store up to 64 cells×100 dies×100 outliers per cell per die=640,000 sampled outliers in its memory. Thus, the total system would have 16×640,000=10 Million sampled outliers in memory at the end of a scan.

In another example, the one or more predetermined criteria may include all segment and region combinations. When a node detects an outlier in the output, the node may determine the segment and region of the outlier. The node may then determine if a sampling cell ID for that segment and region combination has been created or not. If not, the node may create a unique sampling cell with that sampling cell ID/segment/region as the name of the sampling cell and may add that outlier to the sampling cell. If the sampling cell already exists and the node has not already stored sampled outliers up to the capacity of the node for that sampling cell, the node adds the outlier into the sorted list (e.g., sorted by outlier magnitude) of sampled outliers in the sampling cell.

If the sampling cell is "full," the node may determine if the "lowest" sampled outlier (i.e., the sampled outlier having the lowest value for the output) in the list is higher than the current outlier. If so, the node discards the current outlier. If not, the node adds the outlier in the appropriate place in the ordered list after deleting the "lowest" sampled outlier.

In addition, before storing any outlier, the node may check the per frame sampling limit. For example, the node may store up to, but no more than, a predetermined number of outliers from a given job (frame) into a given bin. This predetermined number may be an input parameter. The reason for this restriction is to prevent the bins from being filled by a single dense outlier cluster within a single job.

The jobs or frames from which outliers are sampled may vary. In other words, outliers may not be sampled from all jobs or frames on the wafer. For example, the nodes may use a sample/don't sample flag that may be associated with each job to determine whether any outliers from the job are to be sampled and recorded or not. Such flags may be useful in certain situations such as cases in which only outliers from certain parts of the die/wafer are to be sampled and recorded in node memory. In another instance, for systems with multiple channels, only outliers detected by a certain channel may be sampled and recorded in memory, etc.

In order to sample outliers from all parts of the wafer and all dies as described further herein, the node may use information about the job that the node is processing that is of a "geographical" nature for sampling outliers and may store that geographical data in its memory. This geographical data may include one-time global (i.e., wafer scale) information (e.g., die dimensions, wafer layout, sample plan, etc.), die # (e.g., using some universal die numbering scheme), swath # (can be relative to die row), and its own subswath identity (which subswath the node is assigned to within each swath, which may be fixed). Alternatively, all of the above geographical information may be encoded into a unique "cell ID" that is passed down to the node. For each sampling cell ID, the node may add the segment/region ID and determine the final physical sampling cell that will contain any outlier sampled in that job and in that segment/region.

The nodes may also create the sampling cell data definition. For example, the nodes may record the features specified as job input parameters such as outlier patch/reference patch, patch size, features to be recorded, etc. The nodes may also create the sampling cell summary data definition. For example, the summary report that the node creates may summarize the defect features of the outliers specified as input parameters for the inspection. Typical summary information (per sampling cell) may include: (a) number of outliers in the sampling cell, (b) maximum value of a feature, (c) minimum value of a feature, (d) average value of a feature, (e) standard deviation of feature values in that sampling cell, or some combination thereof. Values for (b) maximum value of a feature, (c) minimum value of a feature, (d) average value of a feature, and (e) standard deviation of feature values in that sampling cell may be provided for each of the requested features.

In step 14 of FIG. 1, each node uploads defects that exceed the one or more recipe defect detection thresholds to the host and uploads summary statistics of the sampled outliers. For example, each node uploads the defects detected with the one or more recipe defect detection thresholds and summary statistics of the other outliers that the node sampled such as number of outliers in each sampling cell, average strength, size, polarity, or other such measures. In another example, upon request, each node sends the cell summary and top N sampled outliers of specified cells to the host. In addition, each node may report (per job) the sampled outlier results to the job manager. In this manner, the nodes may be configured to report sampling cell statistics. For example, the nodes may have the ability to determine summary statistics of the sampled outliers contained in all of the sampling cells and be able to send this summary to the host as described further herein.

The selecting and generating steps are performed by the host. For example, in step 16 of FIG. 1, the host collects defects from all nodes. In addition, the host collects summary statistics from all nodes and constructs wafer scale and stacked die scale summaries. For example, the host collects the summaries from all of the nodes and uses this data to generate a wafer scale "map" of the sampled outliers. The host can use this map to construct a stacked die map combining data across die for each frame within a die.

In step 18 of FIG. 1, the host determines wafer scale problems (signatures) and die scale problems (signatures). For example, the host analyzes the wafer map and stacked die map to determine anomalies. At this point, the host can also use design context information overlaid on the map to determine systematic defect mechanisms that might be occurring. For example, there may be an unusually high number of sampled outliers located in certain design contexts. In addition, the host may use design-based binning to identify potential systematic problems. The host may determine systematic defect mechanisms or use design-based binning to identify potential systematic problems as described in commonly owned U.S. patent application Ser. No. 11/561,735 by Kulkarni et al., published as U.S. Patent Application Publication No. 2007/0156379 on Jul. 5, 2007, and Ser. No. 11/561,659 by Zafar et al., published as U.S. Patent Application Publication No. 2007/0288219 on Dec. 13, 2007, both of which were filed on Nov. 20, 2006 and which are incorporated by reference as if fully set forth herein. The embodiments described herein may include any step(s) of any method(s) described in these patent applications. Or, there may be areas of the wafer in which there are more sampled outliers present (such as "scratches" due to wafer handling), or there could be some signature present in the stacked die map such as areas that are more prone to defects than others. In other to ensure that each type of signature is represented in the inspection results, the host may examine the actual defects reported (in step 14) with the wafer, die, and design context based signatures to determine signatures for which defects were not detected using the one or more defect detection thresholds in the inspection recipe. The host may perform any other wafer-level analysis described herein of the sampled outliers to select a portion of the sampled outliers for reporting.

The host in step 20 of FIG. 1 determines which sampled outliers within each node the host wants to retrieve to complete the inspection results. For example, the host may determine which nodes and which dies/frames/regions/segments need to be queried for sampled outliers and number of sampled outliers to be retrieved per node. As shown in step 22, this list is requested from the nodes. For example, the host may request nodes to upload a number of outliers per sampling cell. The nodes may be configured to report specified outliers from the sampling cells. For example, the nodes may have the ability to send the top N sampled outliers from a specified set of sampling cell IDs to the host upon request from the host. As shown in step 24, each node uploads outliers and defects requested by the host. As shown in step 26, each node uploads the selected outliers and defects to the host. As a special case, the nodes may be able to send back all sampled outliers stored in all of the sampling cells from their memories. The host then produces final result 28 using the selected outliers and defects uploaded by the nodes.

The embodiment of the method shown in FIG. 1 may include any other step(s) described herein. The nodes and the host may be further configured as described in commonly owned U.S. Patent Application Ser. No. 60/974,030 by Bhaskar et al. filed Sep. 20, 2007, which is incorporated by reference as if fully set forth herein. In addition, other computer systems and computer subsystems described herein may be further configured as described in this patent application. The embodiments described herein may also include any step(s) of any method(s) described in this patent application.

The results of the methods described herein may be used in other ways as well. For example, the embodiments described herein may be used to generate results for a wafer that can be used to create an inspection recipe. In this manner, the embodiments described herein can be used during setup by utilizing node memory. In embodiments in which the results of the methods described herein are to be used for recipe setup, the sampling step described herein may be performed as described in commonly owned U.S. patent application Ser. No. 11/859,342 by Chen et al. filed Sep. 21, 2007, which is incorporated by reference as if fully set forth herein. The embodiments described herein may include any step(s) of any method(s) described in this patent application.

Figure 2:
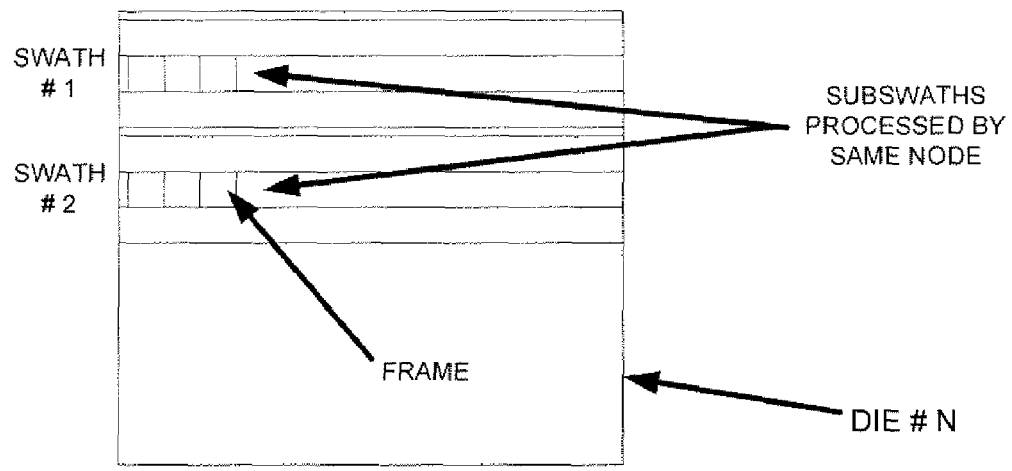
FIG. 2 is a schematic diagram illustrating one embodiment of die/sub-die summary data.
Figure 2:
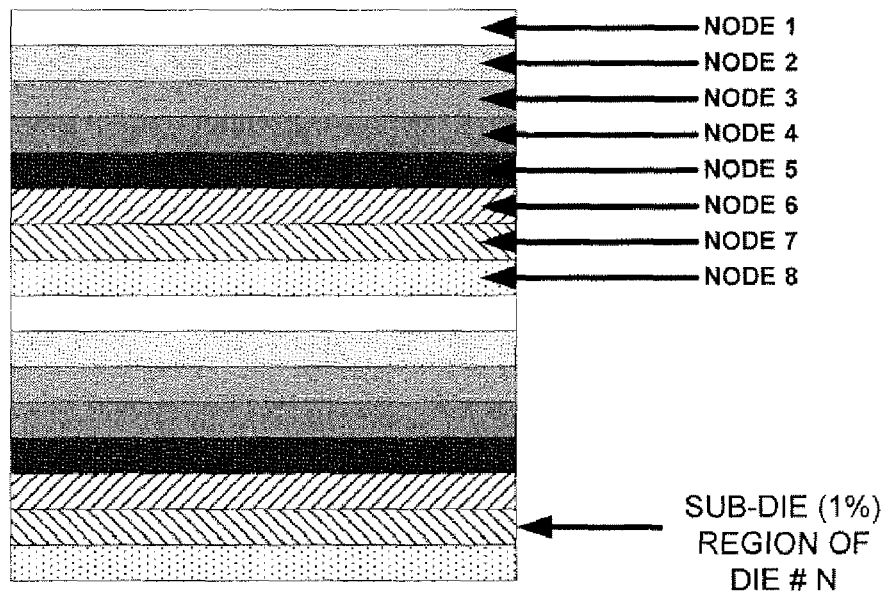
Figure 2:
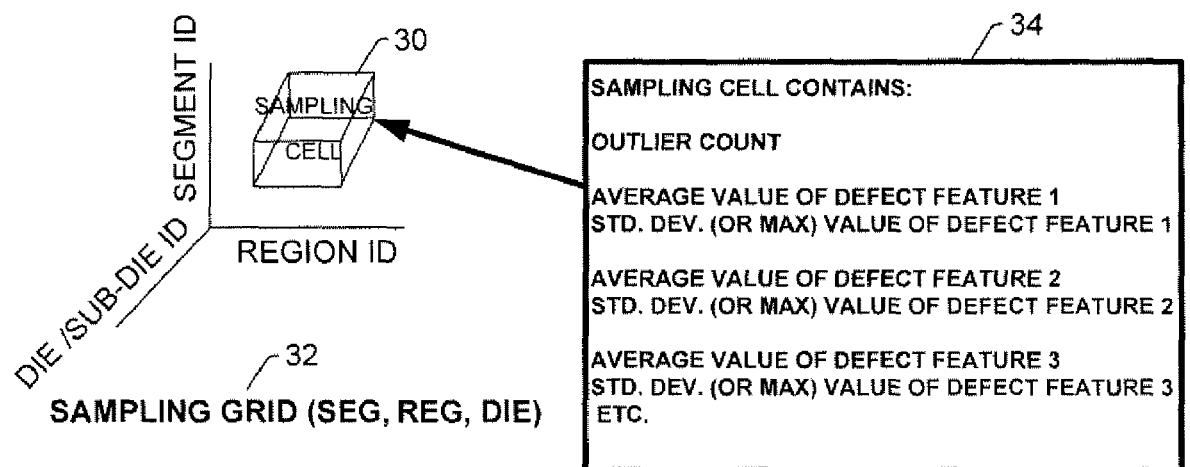

FIG. 2 illustrates one embodiment of die/sub-die summary data. As shown in FIG. 2, die #N on a wafer may be scanned in a number of swaths (e.g., Swath #1, Swath #2, etc.). Corresponding subswaths in each swath may be processed by the same node. Individual frames within each subswath may be processed independently by the nodes. The nodes may be configured as described above. The nodes may process the subswaths as described further herein. As further shown in FIG. 2, the system may include 8 nodes (e.g., Node 1, Node 2, Node 3, . . . Node 8). Each node may process a sub-die (e.g. 1% of the die area) region of die # N as shown in FIG. 2.

As further shown in FIG. 2, sampling cell 30 (and other sampling cells not shown in FIG. 2) may be defined based on one or more predetermined criteria that include region ID, die/sub-die ID, and segment ID. Therefore, as shown in FIG. 2, sampling cell 30 (and other sampling cells) may be defined within sampling grid 32 (based on segment, region, and die), with region ID plotted on the x axis of the grid, die/sub-die ID plotted on the y axis of the grid, and segment ID plotted on the z axis of the grid. As further shown in FIG. 2, information 34 each sampling cell may contain may include outlier count and one or more statistics for one or more defect features of the outliers (e.g., average value of defect feature 1, standard deviation (or max) of defect feature 1, average value of defect feature 2, standard deviation (or max) value of defect feature 2, average value of defect feature 3, standard deviation (or max) of defect feature 3, etc.).

Figure 3:
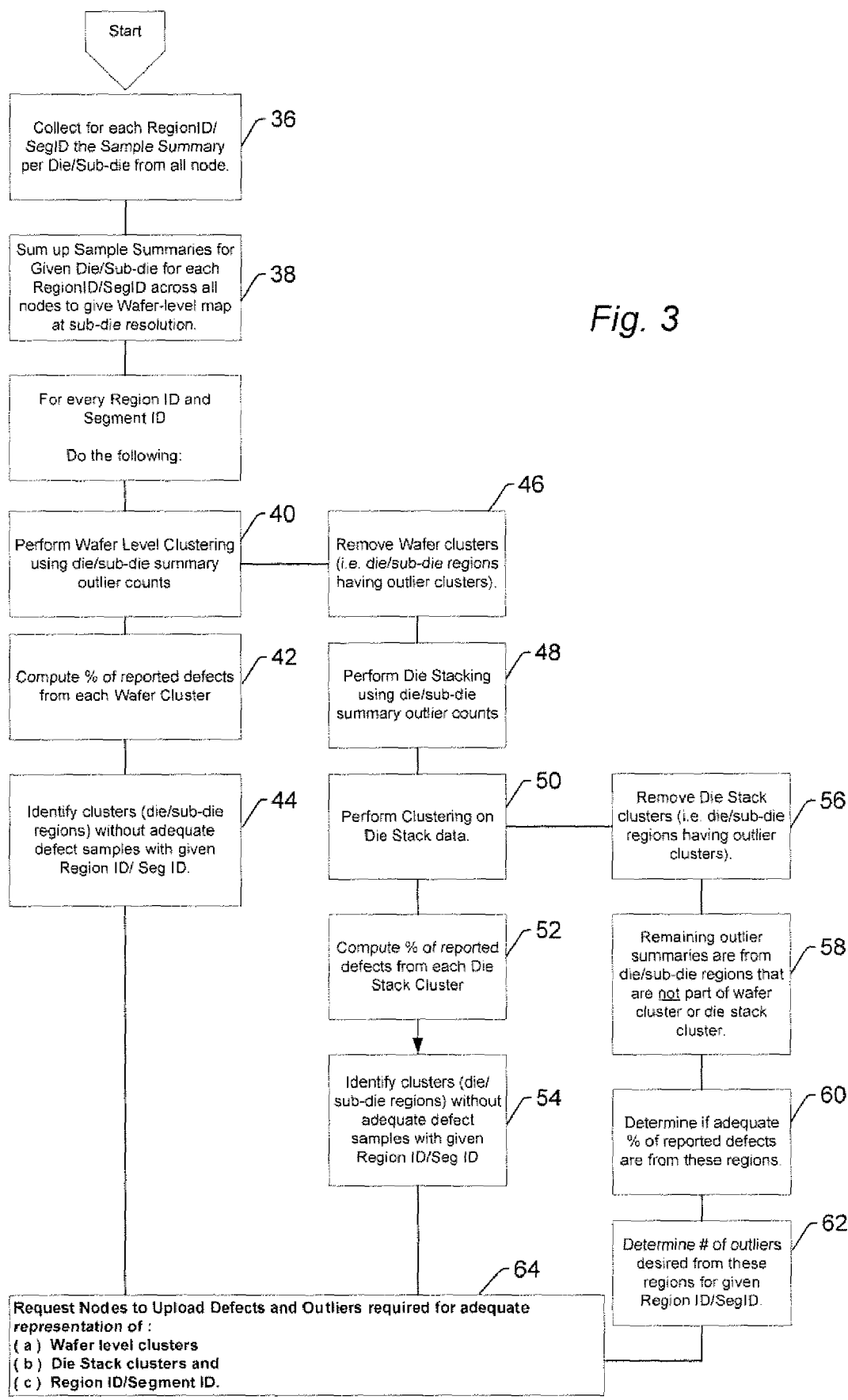
FIG. 3 is a flow chart illustrating one embodiment of multi-level clustering using sample cell summaries.

The embodiments described herein may be configured to provide an infrastructure that provides the user with the flexibility to specify a strategy for selecting a portion of the sampled outliers for "digging" into systematic defect mechanisms. For example, selecting a portion of the sampled outliers based on wafer-level analysis of the sampled outliers described above may include multi-level clustering using sampling cell summaries. FIG. 3 illustrates one embodiment of multi-level clustering using sampling cell summaries (sampling cell summary data). In particular, FIG. 3 shows one possible method for selecting a portion of sampled outliers corresponding to systematic defect mechanisms based on wafer-level and (stacked) die-level clusters. In this manner, the method shown in FIG. 3 is one embodiment of wafer/die cluster-based outlier selecting. It is noted that the steps shown in FIG. 3 are not essential to practice of the method. One or more steps may be omitted from or added to the method illustrated in FIG. 3, and the method can still be practiced within the scope of this embodiment. In addition, although the embodiment shown in FIG. 3 is described with respect to selecting outliers, the embodiment shown in FIG. 3 may also be used to sample defects from a population of defects detected by comparing output generated by scanning the wafer to one or more defect detection thresholds. Furthermore, although the method shown in FIG. 3 is described with respect to one or more predetermined criteria that include region and segment, the method shown in FIG. 3 may be performed for any other one or more predetermined criteria described herein.

During an inspection scan, each node retains the top N outliers it encounters in each sampling cell (which may represent the regions of a die that the node processes) and for each region or segment. The method shown in FIG. 3 starts with step 36 that includes collecting for each region ID/segment ID, the sample summary per die/sub-die from all nodes. For example, upon receiving a command from the host to compute a summary report (at the end of the scan), each node may compute the following values for each sampling cell: (a) total number of outliers in the sampling cell; (b) maximum value of difference gray level for the outliers in the sampling cell; (c) average value of gray level difference for outliers in the sampling cell, etc.

As shown in step 38 of FIG. 3, the method includes summing up the sample summaries for a given die/sub-die for each region ID/segment ID across all nodes to create a wafer-level map at sub-die resolution. For example, since each node examines a different geographical region of each die, the host application may construct a collage of a particular measure across the whole wafer by assembling the summary inputs received from all nodes.

For every region ID and segment ID, the method includes performing the following steps. The method includes wafer-level clustering using die/sub-die summary outlier counts, as shown in step 40 of FIG. 3. The choice of the appropriate parameter to be clustered may be evaluated. Some possible choices may be: (a) total number of outliers, (b) maximum value of gray level difference; (c) average value of gray level difference, etc.

Wafer-level clustering may include wafer cluster analysis. For example, using the chosen parameter to be clustered, the method may include constructing an "image" of the wafer in which each "pixel" represents a sampling cell and the intensity of each pixel represents the parameter values. Assuming that, for example, each pixel (sampling cell) represents a 10 frame×20 frame block and each frame is 1024 pixels×512 pixels, each sampling cell covers 10,000 pixels×10,000 pixels (a 500 micron×500 micron area) on the wafer, assuming a 50 nm pixel. Based on these assumptions, there would be roughly 270,000 pixels (sampling cells) on a wafer. The method may then include searching for "large" areas on the wafer in which the value of the parameter represented is relatively large. For example, the method may include constructing a histogram of all values across the wafer and searching for bimodality (a collection of sampling cells with relatively high values separated from other sampling cells with lower values) in the histogram. Alternatively, the method may include searching for sampling cells that exceed some (K*standard deviation) value of the distribution (i.e., outlying sampling cells in the distribution). The method may also include examining only clusters of such outlying sampling cells that exceed some size (area on the wafer), or the method may include considering all outlying sampling cells even if these outlying sampling cells are sparsely distributed across the wafer.

As shown in step 42 of FIG. 3, the method includes computing percent of reported defects from each wafer cluster. As shown in step 44 of FIG. 3, the method includes identifying clusters (die/sub-die regions) without adequate defect samples for a given region ID/segment ID. For example, the method may include examining the list of detected defects and determining if each cluster (outlying) sampling cell is represented in that list. If there is no representative defect reported from a given cluster, the method may include determining how and from where to select a representative outlier or outliers. It may be reasonable to select the outlier(s) from the sampling cell belonging to the cluster that has the highest value of that parameter. For example, if maximum gray level difference is the chosen parameter for cluster analysis, the topmost N outlier(s) may be selected from the sampling cell in the cluster with the largest value of the gray level difference. The node that processed the particular sampling cell is then queried to retrieve the topmost N outliers from that sampling cell and segment/region such that the outliers for adequate representation of wafer level clusters can be uploaded as described further herein.

The above clustering and outlier selecting steps are repeated for each segment and region. Thus, if there are 4 region types and each has 3 segments, the above clustering and outlier selecting steps would be performed 12 times.

As shown in step 46 of FIG. 3, the method includes removing wafer clusters (i.e., die/sub-die regions having outlier clusters). For example, after all segments and regions have been processed, all clusters so found may be eliminated from further consideration for die stacking. To do this, the host application may construct a wafer-scale "sampling cell mask" for each segment and region such that all sampling cells that contribute to a wafer cluster are turned off (set to 0) and the remaining are turned on (set to 1). Only the remaining sampling cells are processed in the following way.

As shown in step 48 of FIG. 3, the method includes performing die stacking using die/sub-die summary outlier counts. For example, to perform die stacking, each sampling cell (which is non-zero in the sampling cell mask) is combined with all the corresponding sampling cells from all dies. In one such example, if there are M die on the wafer, and there are L sampling cells per die, for each of the L sampling cells that is non-zero in the sampling cell mask, the parameter values from the M die may be combined in some manner. Possible ways of combining the M sampling cell values include: (a) maximum of M sampling cell parameters; (b) average value of the M sampling cell parameters; and (c) weighted average of the M sampling cell values (i.e., the contribution from each sampling cell is weighted by the number of outliers in that sampling cell). The result of die stacking is a stacked die "image" in which each pixel represents a stacked sampling cell (across M dies).

As shown in step 50 of FIG. 3, the method includes performing clustering on die stack data. For example, a method similar to the one used for wafer clustering can be applied to determine clusters (or outlying sampling cells) in the stacked die image. As shown in step 52 of FIG. 3, the method includes computing the percentage of reported defects from each die stack cluster. As shown in step 54 of FIG. 3, the method includes identifying clusters (die/sub-die regions) without adequate detected defects with a given region ID/segment ID. For example, each cluster may be examined to determine if the cluster has a defect or defects represented in the selected defect list. If not, the appropriate node may be queried for the top N outliers. The die region chosen may be the one belonging to the stacked die cluster with the maximum value of the stacked parameter value. The node may be queried for the top N outliers from each of the sampling cells comprising the stack (i.e., from each of the M die). Alternatively, only the top outlier or outliers from the sampling cell in the stack that contributed the most to the stack value may be retrieved.

The above stacked die processing is repeated for each segment and each region. Again, assuming 4 region types of 3 segments each, the die stacking will be repeated 12 times. At the end of the above steps, one would have a list of all wafer and die stacked clusters for every segment and region and representative defect(s) and outlier(s) from each one of the above clusters.

As shown in step 56 of FIG. 3, the method includes removing die stack clusters (i.e., die/sub-die regions having outlier clusters). For example, for random defect analysis, the stacked die cluster sampling cells may be eliminated from further processing by constructing a die stack mask for each segment and region. The sampling cells that are set to 0 in the die stack mask are then set to 0 in the previously constructed wafer level sampling cell mask in each of the M dies. Step 56 of FIG. 3 produces results 58 shown in FIG. 3 that include remaining outlier summaries that are from die/sub-die regions that are not part of wafer clusters or die stack clusters. For example, the resulting wafer-scale sampling cell mask may be one in which every sampling cell that contributed to a wafer cluster or die stack cluster is set to 0. The remaining sampling cells represent sampling cells containing "random" outliers that do not belong to any wafer or stacked die cluster.

As shown in step 60 of FIG. 3, the method may include determining if an adequate percentage of reported defects are from these regions. For example, the method may include determining if there are representative defects reported from any of these sampling cells. As shown in step 62 of FIG. 3, the method includes determining the number of outliers desired from these regions for a given region ID/segment ID. The sampling cells with the maximum value of the parameter may be queried to retrieve the topmost N outliers belonging in this segment and region. The above steps of removing wafer and die clusters and examining the remaining random outlier sampling cells may be repeated for each segment and region. At the end of these steps, the results include representative outliers from the random outlier population for each segment and region.

The results of steps 44, 54, and 62 are used in step 64 of FIG. 3 that includes requesting nodes to upload defects and outliers required for adequate representation of (a) wafer-level clusters, (b) die stack clusters, and (c) region ID/segment ID. Therefore, the method shown in FIG. 3 performs clustering on multiple levels that include the wafer level and the die stack level. The selecting step of any of the embodiments of the method described herein may be performed as shown in FIG. 3.

Other sampling strategies are possible including conditional sampling. For example, in one embodiment, the selecting step includes selecting the portion of the sampled outliers conditionally based on results of the wafer-level analysis of other sampled outliers. In one such example, the method may include examining sampling cell summaries of certain sampling cells (e.g., SRAM areas) and based on the values, extracting additional outliers from random logic areas adjacent to those regions. In this manner, a portion of the sampled outliers may be selected conditionally on the results of the analysis of other sampled outliers.

The embodiments described herein may also include storing results of one or more steps of one or more computer-implemented methods described herein in a storage medium. The results may include any of the results described herein. The results may be stored in any manner known in the art. The storage medium may include any suitable storage medium known in the art. After the results have been stored, the results can be accessed in the storage medium and used by any of the method or system embodiments described herein, any other method, or any other system Furthermore, the results may be stored "permanently," "semi-permanently," temporarily, or for some period of time. For example, the storage medium may be random access memory (RAM), and the results may not necessarily persist in the storage medium.

The embodiments described herein have a number of advantages over other methods and systems for detecting defects on a wafer and generating inspection results for the wafer. For example, previous wafer inspection methods detect defects based on local comparisons or comparison to a golden (reference) die but do not have the ability to detect more subtle defect mechanisms that may be at work below the defect detection threshold(s) specified in the recipe. In contrast, the embodiments described herein are advantageous in that defects are caught based on local analysis (e.g., die-to-die comparisons) as well as global analysis (e.g., wafer-level, stacked die-level signatures). In addition, the embodiments described herein can dive deeper into the noise floor (selectively) to extract more defects of interest (DOIs). Furthermore, the embodiments described herein may be advantageously performed with user-configurable sampling criteria.

Running a substantially hot recipe also is not practical because such a recipe results in a substantially large number of defects being sent to the host, which would have to analyze all of the defects to produce a representative sample for review. The embodiments described herein solve this problem by recording a substantially large number of defects and outliers in node memory during the scan, then immediately analyzing the summary of this outlier set at a wafer level and finally retrieving the defects and a selected sample of the outliers from node memory as the final result of inspection. In this manner, the embodiments described herein use relatively large capacity in node memory to store defects and outliers until requested by the host after analysis. This approach has the advantage of speed since fewer defects have to be sent up to the host for final review and include defects both random and due to certain systematic mechanisms that can be detected only by analysis performed at the wafer level. In addition, the embodiments described herein have a negligible impact on throughput of the inspection recipe.

Figure 4:
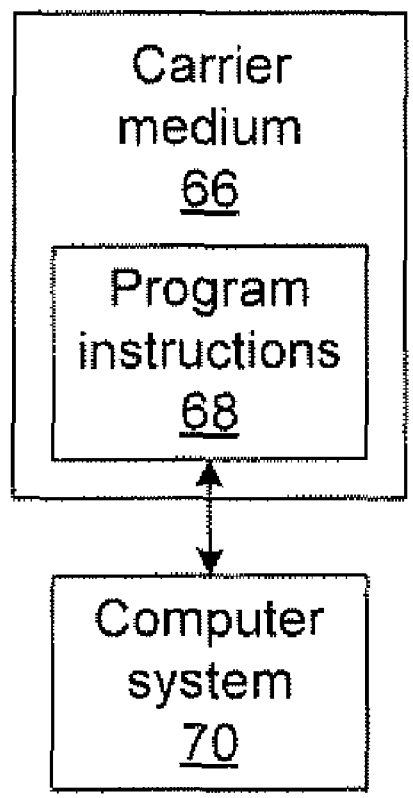
FIG. 4 is a block diagram illustrating one embodiment of a computer-readable medium that includes program instructions executable on a computer system for performing a computer-implemented method for detecting defects on a wafer and generating inspection results for the wafer.

Another embodiment relates to a computer-readable medium that includes program instructions executable on a computer system for performing a computer-implemented method for detecting defects on a wafer and generating inspection results for the wafer. One such embodiment is shown in FIG. 4. For example, as shown in FIG. 4, computer-readable medium 66 includes program instructions 68 executable on computer system 70 for performing a computer-implemented method for detecting defects on a wafer and generating inspection results for the wafer.

The computer-implemented method includes detecting defects on a wafer by comparing output generated by scanning of the wafer performed by an inspection system to one or more defect detection thresholds. The output may include any of the output described herein. The scanning of the wafer may be performed as described further herein. The inspection system may include any of the inspection systems described herein. The one or more defect detection thresholds may include any of the defect detection threshold(s) described herein. Detecting the defects may be performed according to any of the embodiments described herein.

The computer-implemented method also includes sampling outliers in the output by selecting the output having the highest values from bins defined based on one or more predetermined criteria. The bins defined based on the one or more predetermined criteria may include any of the bins described herein. The one or more predetermined criteria may include any of the predetermined criteria described herein. Sampling the outliers may be performed according to any of the embodiments described herein.

The computer-implemented method further includes selecting a portion of the sampled outliers based on wafer-level analysis of the sampled outliers. The wafer-level analysis may include any of the wafer-level analysis described herein. Selecting the portion of the sampled outliers may be performed according to any of the embodiments described herein. The method also includes generating inspection results for the wafer by combining information about the selected portion of the sampled outliers with information about the defects detected using the one or more defect detection thresholds. The information about the selected portion of the sampled outliers may include any such information described herein. The information about the defects detected using the one or more defect detection thresholds may include any such information described herein. Generating the inspection results may be performed according to any of the embodiments described herein. The computer-implemented method for which the program instructions are executable may include any other step(s) of any other method(s) described herein.

Program instructions 68 implementing methods such as those described herein may be transmitted over or stored on computer-readable medium 66. The computer-readable medium may be a transmission medium such as a wire, cable, or wireless transmission link The computer-readable medium may also be a storage medium such as a read-only memory, a RAM, a magnetic or optical disk, or a magnetic tape.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 70 may take various forms, including a personal computer system, mainframe computer system, workstation, system computer, image computer, programmable image computer, parallel processor, or any other device known in the art. In general, the term "computer system" may be broadly defined to encompass any device having one or more processors, which executes instructions from a memory medium.

Figure 5:
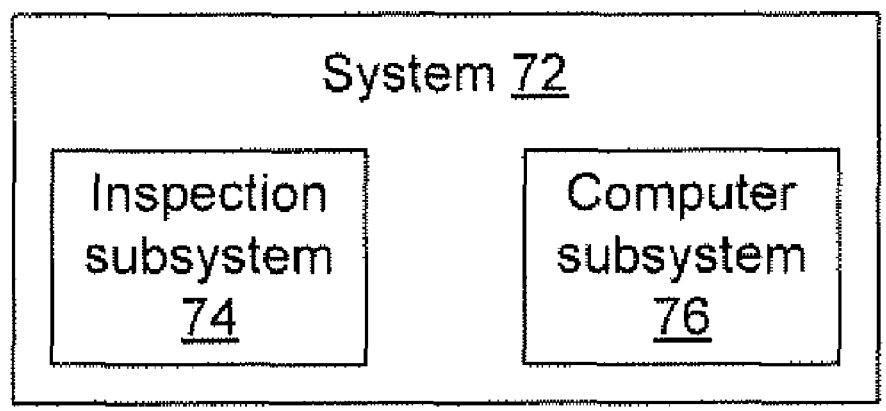
FIG. 5 is a block diagram illustrating one embodiment of a system configured to detect defects on a wafer and generate inspection results for the wafer.

An additional embodiment relates to a system configured to detect defects on a wafer and generate inspection results for the wafer. One embodiment of such a system is shown in FIG. 5, As shown in FIG. 5, system 72 includes inspection subsystem 74 and computer subsystem 76. The computer subsystem may be a computer subsystem of an inspection system and as such may form part of or be included in the inspection system. The system may be configured as an inspection system, which may be further configured as described herein.

Inspection subsystem 74 is configured to generate output by scanning a wafer The inspection subsystem may be configured to generate the output by scanning the wafer as described further herein. The inspection subsystem may be configured to perform any other steps described herein. The inspection subsystem may have any suitable configuration for inclusion in any of the inspection systems described herein.

Computer subsystem 76 is configured to detect defects on the wafer by comparing the output to one or more defect detection thresholds. The computer subsystem may be configured to detect the defects according to any of the embodiments described herein. The computer subsystem is also configured to sample outliers in the output by selecting the output having the highest values from bins defined based on one or more predetermined criteria. The computer subsystem may be configured to sample the outliers according to any of the embodiments described herein. In addition, the computer subsystem is configured to select a portion of the sampled outliers based on wafer-level analysis of the sampled outliers. The computer subsystem may be configured to select the portion of the sampled outliers according to any of the embodiments described herein. The computer subsystem is further configured to generate inspection results for the wafer by combining information about the selected portion of the sampled outliers with information about the defects detected using the one or more defect detection thresholds. The computer subsystem may be configured to generate the inspection results for the wafer according to any of the embodiments described herein. The embodiment of the system described above may be further configured as described herein (e.g., to perform any other step(s) of any of the embodiment(s) of the method(s) described herein).

Further modifications and alternative embodiments of various aspects of the invention may be apparent to those skilled in the art in view of this description. For example, systems and methods for detecting defects on a wafer and generating inspection results for the wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for detecting defects on a wafer and generating inspection results for the wafer, comprising:
    detecting defects on a wafer by comparing output generated by scanning of the wafer performed by an inspection system to one or more defect detection thresholds;
    sampling outliers in the output by selecting the outputs having the highest values from bins defined based on one or more predetermined criteria;
    selecting a portion of the sampled outliers based on wafer-level analysis of the sampled outliers; and
    generating inspection results for the wafer by combining information about the selected portion of the sampled outliers with information about the defects detected using the one or more defect detection thresholds;
    wherein the wafer-level analysis comprises identifying one or more signatures present in the sampled outliers, and wherein said selecting comprises comparing the defects detected using the one or more defect detection thresholds to the one or more signatures and selecting at least some of the sampled outliers such that the inspection results include at least some of the sampled outliers or defects corresponding to each of the one or more signatures.

2. The method of claim 1, wherein the one or more defect detection thresholds do not comprise a hot threshold.

3. The method of claim 1, wherein said sampling is performed without applying a defect detection threshold to the output.

4. The method of claim 1, wherein a substantial portion of the sampled outliers have values below the one or more defect detection thresholds.

5. The method of claim 1, wherein said sampling is performed for only the output that does not correspond to the defects detected using the one or more defect detection thresholds.

6. The method of claim 1, wherein the number of outliers that is sampled is limited only by memory capacity of a computer subsystem that performs said sampling.

7. The method of claim 1, wherein said sampling comprises sampling a number of the outliers from each of the bins.

8. The method of claim 1, wherein the sampled outliers and the defects comprise random defects and systematic defects.

9. The method of claim 1, wherein the selected portion of the sampled outliers does not comprise all of the sampled outliers.

10. The method of claim 1, wherein the wafer-level analysis comprises statistical analysis of the sampled outliers and identifying patterns in results of the statistical analysis.

11. The method of claim 1, wherein the wafer-level analysis comprises analyzing the sampled outliers for wafer-level signatures.

12. The method of claim 1, wherein the wafer-level analysis comprises creating a wafer map from the sampled outliers, and wherein said selecting comprises analyzing the wafer map to select the portion of the sampled outliers.

13. The method of claim 1, wherein the wafer-level analysis comprises creating a stacked die map from the sampled outliers and analyzing the stacked die map to identify a signature in the stacked die map, and wherein said selecting comprises selecting the portion of the sampled outliers based on the signature in the stacked die map.

14. The method of claim 1, wherein the wafer-level analysis comprises overlaying design context information on a map of the sampled outliers and identifying one or more systematic defect mechanisms based on the design context information overlaid on the map, and wherein said selecting comprises selecting at least some of the sampled outliers corresponding to the one or more systematic defect mechanisms.

15. The method of claim 1, wherein the one or more predetermined criteria comprise gray level, local texture, difference gray level between die, region type, design context or some combination thereof.

16. The method of claim 1, wherein the wafer-level analysis comprises identifying an area on the wafer in which a number of the sampled outliers located in the area is higher than other areas on the wafer, and wherein said selecting comprises selecting at least some of the sampled outliers located in the area.

17. The method of claim 1, wherein said selecting comprises selecting the portion of the sampled outliers conditionally based on results of the wafer-level analysis of other sampled outliers.

18. The method of claim 1, wherein said detecting and said sampling are performed by computer nodes, and wherein said selecting and said generating are performed by a host.

19. A computer-readable medium, comprising program instructions executable on a computer system for performing a computer-implemented method for detecting defects on a wafer and generating inspection results for the wafer, wherein the computer-readable medium is a storage medium, and wherein the computer-implemented method comprises:
    detecting defects on a wafer by comparing output generated by scanning of the wafer performed by an inspection system to one or more defect detection thresholds;
    sampling outliers in the output by selecting the outputs having the highest values from bins defined based on one or more predetermined criteria
    selecting a portion of the sampled outliers based on wafer-level analysis of the sampled outliers; and
    generating inspection results for the wafer by combining information about the selected portion of the sampled outliers with information about the defects detected using the one or more defect detection thresholds;
    wherein the wafer-level analysis comprises identifying one or more signatures present in the sampled outliers, and wherein said selecting comprises comparing the defects detected using the one or more defect detection thresholds to the one or more signatures and selecting at least some of the sampled outliers such that the inspection results include at least some of the sampled outliers or defects corresponding to each of the one or more signatures.

20. A system configured to detect defects on a wafer and generate inspection results for the wafer, comprising:
   an inspection subsystem configured to generate output by scanning a wafer; and
   a computer subsystem configured to detect defects on the wafer by comparing the output to one or more defect detection thresholds, sample outliers in the output by selecting the outputs having the highest values from bins defined based on one or more predetermined criteria, select a portion of the sampled outliers based on wafer-level analysis of the sampled outliers, and generate inspection results for the wafer by combining information about the selected portion of the sampled outliers with information about the defects detected using the one or more defect detection thresholds, wherein the wafer-level analysis comprises identifying one or more signatures present in the sampled outliers, and wherein said selecting comprises comparing the defects detected using the one or more defect detection thresholds to the one or more signatures and selecting at least some of the sampled outliers such that the inspection results include at least some of the sampled outliers or defects corresponding to each of the one or more signatures.

* * * * *